(12) United States Patent
Ebenezer et al.

(10) Patent No.: US 9,980,070 B2
(45) Date of Patent: May 22, 2018

(54) APPARATUS AND METHOD FOR MEASURING RELATIVE FREQUENCY RESPONSE OF AUDIO DEVICE MICROPHONES

(71) Applicant: Cirrus Logic, Inc., Austin, TX (US)

(72) Inventors: Samuel Ponvarma Ebenezer, Tempe, AZ (US); Seth Suppappola, Tempe, AZ (US); Clifton Cordes, Mesa, AZ (US)

(73) Assignee: Cirrus Logic, Inc., Austin, TX (US)

( * ) Notice: Subject to any disclaimer, the term of this patent is extended or adjusted under 35 U.S.C. 154(b) by 3 days.

(21) Appl. No.: 15/593,170

(22) Filed: May 11, 2017

(65) Prior Publication Data

US 2017/0251317 A1  Aug. 31, 2017

Related U.S. Application Data

(62) Division of application No. 14/454,576, filed on Aug. 7, 2014, now Pat. No. 9,674,626.

(51) Int. Cl.
*H04R 29/00* (2006.01)
*H04R 1/08* (2006.01)
(Continued)

(52) U.S. Cl.
CPC .......... *H04R 29/006* (2013.01); *H04R 1/083* (2013.01); *H04R 1/326* (2013.01); *H04R 3/005* (2013.01);
(Continued)

(58) Field of Classification Search
CPC .. H04R 29/005; H04R 29/004; H04R 29/006; H04R 3/005; H04R 1/083; H04R 1/326;
(Continued)

(56) References Cited

U.S. PATENT DOCUMENTS 2,394,613 A * 2/1946 Houlgate ............... H04R 29/00
367/13
2,794,167 A * 5/1957 Jones, Jr. ............... G01R 31/02
324/507

(Continued)

FOREIGN PATENT DOCUMENTS

WO   WO 2010026724 A1 *  3/2010  ............. G01H 17/00
WO   WO2010026724 A1     3/2010
WO   WO-2010026724    *  3/2011  ............. H04R 29/00

*Primary Examiner* — Oyesola C Ojo
(74) *Attorney, Agent, or Firm* — Cahill Glazer PLC

(57) ABSTRACT

Test apparatus measuring relative frequency response of first and second microphones includes a rotatable carrier. First and second microphones are sealingly clamped against a mounting surface of the carrier aligned with first and second apertures therein, such apertures lying equidistant from, and on opposite sides of, the carrier's axis of rotation. The carrier initially positions the first microphone closest to an audible signal source, and the responses of the microphones to an audible excitation signal are measured. The carrier is rotated 180 degrees, and the measurements are repeated. Elongated strips of gasket material are used to align the microphones and to form a seal with the carrier. When microphones are mounted deep within an audio device, the audio device is sealingly clamped against a mounting plate, sequentially aligning the mounting plate aperture with first and second apertures of the audio device housing corresponding to first and second microphones disposed therein.

15 Claims, 7 Drawing Sheets

(51) Int. Cl.
*H04R 1/32* (2006.01)
*H04R 3/00* (2006.01)
*G01R 31/3167* (2006.01)
*G01R 31/319* (2006.01)
*G01R 31/317* (2006.01)
*G01R 25/00* (2006.01)

(52) U.S. Cl.
CPC .......... *G01R 25/00* (2013.01); *G01R 31/3167* (2013.01); *G01R 31/31701* (2013.01); *G01R 31/31901* (2013.01); *G01R 31/31905* (2013.01)

(58) Field of Classification Search
CPC ............... G01R 25/00; G01R 31/3167; G01R 31/31701; G01R 31/31905; G01R 31/31901
USPC .......................................................... 380/361
See application file for complete search history.

(56) References Cited

U.S. PATENT DOCUMENTS

| | | | | |
|---|---|---|---|---|
| 3,858,437 | A * | 1/1975 | Jarzynski | G01H 5/00 73/597 |
| H000413 | H * | 1/1988 | Lelie | 381/58 |
| 4,970,907 | A * | 11/1990 | Flynn | G01N 29/223 73/1.82 |
| 5,224,170 | A | 6/1993 | Waite, Jr. | |
| 5,567,863 | A | 10/1996 | Larson et al. | |
| 6,914,989 | B2 | 7/2005 | Janse et al. | |
| 7,247,979 | B2 * | 7/2007 | Umina | G01D 11/245 310/311 |
| 7,492,909 | B2 | 2/2009 | Carter, Jr. | |
| 8,009,840 | B2 | 8/2011 | Kellermann et al. | |
| 8,243,952 | B2 | 8/2012 | Thormundsson et al. | |
| 8,452,019 | B1 | 5/2013 | Fomin et al. | |
| 9,031,246 | B2 * | 5/2015 | Burnett | H04R 29/004 381/59 |
| 9,247,366 | B2 * | 1/2016 | Doller | H04R 29/004 |
| 2004/0165735 | A1 | 8/2004 | Opitz | |
| 2006/0262950 | A1 * | 11/2006 | Burns | H04R 25/30 381/312 |
| 2007/0139067 | A1 * | 6/2007 | Beier | G01R 31/2831 324/756.07 |
| 2007/0244698 | A1 | 10/2007 | Dugger et al. | |
| 2007/0269051 | A1 * | 11/2007 | Weidner | G10K 11/1788 381/60 |
| 2008/0175407 | A1 * | 7/2008 | Zhang | H04R 3/005 381/92 |
| 2009/0304192 | A1 * | 12/2009 | Zhuang | H04R 29/004 381/58 |
| 2010/0027809 | A1 | 2/2010 | Liu et al. | |
| 2011/0002471 | A1 | 1/2011 | Wihardja et al. | |
| 2011/0051951 | A1 * | 3/2011 | Burnett | G10L 21/0208 381/92 |
| 2011/0051953 | A1 | 3/2011 | Makinen et al. | |
| 2012/0006749 | A1 | 5/2012 | Buck et al. | |
| 2012/0106749 | A1 * | 5/2012 | Buck | H04R 3/005 381/66 |
| 2012/0269356 | A1 | 10/2012 | Sheerin et al. | |
| 2014/0076052 | A1 * | 3/2014 | Doller | B81C 99/005 73/587 |
| 2014/0328489 | A1 * | 11/2014 | Ziegler | H04R 29/004 381/58 |
| 2015/0010157 | A1 * | 1/2015 | Doller | H04R 29/004 381/58 |

* cited by examiner

APPARATUS AND METHOD FOR MEASURING RELATIVE FREQUENCY RESPONSE OF AUDIO DEVICE MICROPHONES

CROSS-REFERENCE TO RELATED APPLICATIONS

This application is a division of co-pending parent U.S. patent application Ser. No. 14/454,576, filed on Aug. 7, 2014, for "Apparatus and Method for Measuring Relative Frequency Response of Audio Device Microphones", and the benefit of the earlier filing date of such parent U.S. patent application Ser. No. 14/454,576 is claimed hereby under 35 U.S.C. § 120.

BACKGROUND OF THE INVENTION

1. Field of the Invention

The present invention relates generally to audio devices which incorporate microphones for sensing sound, and more particularly, to an apparatus and method for measuring the relative frequency response of two or more microphones provided within such an audio device to facilitate a fixed calibration compensation system.

2. Description of the Relevant Art

A microphone is one of the key components in many audio products, including those used for telecommunications. A microphone is a transducer that converts acoustic (sound) energy into electrical energy. It is known to employ speech enhancement algorithms and/or noise reduction algorithms within such products to process incoming signals from a microphone to enhance the performance of such products in acoustically challenging environments, e.g., in the presence of unwanted background noise.

Until recently, the majority of consumer electronics used only a single microphone. With rapid advances in high speed digital signal processors, speech enhancement algorithms and noise reduction algorithms have started using two or more microphones to exploit the spatial diversity that exists between such microphones. In certain scenarios, these multiple-microphone-based algorithms can provide sound quality far superior to single microphone implementations. Today, speakerphones, conference phones used to conduct telephone conference calls in an office conference room, and even Bluetooth® telephone earpieces, often employ two or more microphones to sense surrounding sounds. In the case of conference phones, the use of multiple microphones, together with digital signal processing, helps to ensure that all speakers are detected while allowing the audio device to focus on the active speaker at any given point in time. The use of multiple microphones is also key to achieving echo cancellation and suppression of unwanted background noise signals.

However, the improved performance of these multiple-microphone-based algorithms introduces many new problems. For example, it has been found that audio devices that use multiple microphones to achieve speech enhancement and/or noise reduction perform poorly if the frequency responses of such microphones are not well matched. If the microphones used within a particular audio device are well matched to each other, then the relative frequency response will be approximately zero over the frequency band of interest, both in terms of relative magnitude and relative phase.

Both the magnitude and the phase responses of the microphones are critical to successful implementation of modern algorithms for speech enhancement and noise reduction. In some cases, it is not necessary to know the individual phase response of a particular microphone; instead, the relative phase response between any two microphones is sufficient information for most of the algorithms to work properly. Accordingly, if it were possible to determine the relative frequency response, including the relative magnitude and the relative phase responses, between two microphones, then such information can be used to compensate for differences between such microphones. Unlike magnitude response measurement, relative phase response measurement between two microphones is an extremely difficult problem. At higher frequencies, even a small positional variation in the measurement set-up (even of a few millimeters) can drastically affect the phase measurement results. In order to comply with ITU-T wide band mode standards, the relative frequency response must be considered over at least the range of 100 Hz to 7000 Hz.

Various compensation techniques have been used in the past to account for microphones that differ in relative frequency response. Self-calibration is a technique used to adjusting the parameters of a compensation system using an excitation signal that is usually present during the normal mode of operation of the audio device. One example of this self-calibration technique is disclosed within Patent Application Publication No. US 2004/0165735, published Aug. 26, 2004. On-line calibration is a second technique adjusting the parameters of a compensation system, wherein the parameters of the calibrating system are adaptively updated during the normal mode of operation. An example of this calibration technique is disclosed within U.S. Pat. No. 6,914,989, issued to Janse, et al., on Jul. 5, 2005.

A third technique used to adjust the parameters of a compensation system is known as "fixed calibration"; a fixed calibration technique refers to measuring the relative frequency response between a pair of microphones using an off-line process, and then initializing a fixed set of calibration parameters based on the measurement. One of the difficulties of effectively implementing a fixed calibration compensation technique is accurately determining the relative frequency response as between two microphones. To accurately determine such relative frequency response as between two microphones within a frequency band of interest, one must know both the differences in the magnitude response of the two microphones as well as the differences in phase response of the two microphones.

In addition, within some audio devices, the audio path to the first microphone and the audio path to the second microphone differ from each other. Thus, even if the two microphones were themselves perfectly matched to each other, the difference in the respective audio paths leading to the first and second microphones may result in a relative frequency response that needs to be compensated. In some audio products, the microphones are mounted deep inside the outer housing of the product. The frequency response of the installed microphones can sometimes drastically differ from the free standing frequency response of each such microphone. Accordingly, the mechanical design of the microphone housing, along with the acoustic path inside the product, can greatly affect the overall frequency response of the acquired signal that will be used for further signal processing.

Some of the factors that will affect the overall frequency response are: the acoustic tube length from the microphone hole in an audio product to the port in the microphone capsule; multi-path acoustic leakage; resonant cavities; and improper microphone booting. Hence, for those products in which microphones are embedded deep within the outer housing, it is important to measure the overall frequency response that encompasses both the microphone itself and the acoustic path to the microphone, rather than merely measuring the frequency response of the free standing microphone. The measurement logistics are further complicated by the fact that audio products using the same types of microphones come in various shapes and sizes. The accessibility of microphone holes further complicates the measurement process too.

Adding to the complexity of relative frequency response, there are a variety of different types of microphones in current use, including electret condenser microphones (or "ECMs") and micro electro-mechanical system (so-called "MEMS") microphones. A cylindrically-shaped electret (ECM) microphone might have typical dimensions of 9.5 mm in diameter×6.3 mm in height. In contrast, a cuboidal micro electro-mechanical system (MEMS) microphone would typically have much smaller dimensions, on the order of 3.76 mm in length, ×3.0 mm in width, ×1.1 mm in height. A test apparatus used to detect the relative frequency response of microphones would need to be capable of accommodating at least both such types of microphones.

One known technique for measuring the relative frequency response as between two microphones is to position both microphones within a test chamber, equidistant from a loudspeaker, and to alternately measure the response of each microphone to an excitation signal issued by the loudspeaker. However, the two microphones are positioned at two different points in space within the test chamber, each having its own unique propagation path. As already noted above, differences in the propagation paths for two microphones can change the effective relative frequency response of such microphones. It is therefore important to minimize any differences in the propagation paths to the microphones under test when designing a measurement set up in order to obtain accurate results.

Theoretically, one could maintain the propagation path to the two microphones substantially constant by first positioning the first microphone at a given point in the test chamber, measuring the frequency response of the first microphone, then removing the first microphone, replacing it with the second microphone at the same given point, and measuring the frequency response of the second microphone. However, even small changes in a physical set up between two successive measurements can alter the acoustic field. For example, the acoustic field can change when the first microphone is manually replaced by the second microphone in the measurement set up. A small change in the apparatus position between the two measurements can also introduce different diffraction patterns, thereby affecting the acoustic field at the sensing point.

Accordingly, it is an object of the present invention to provide a test set-up apparatus and method for measuring the phase and magnitude differences between first and second microphones for use in a fixed calibration system in a manner that is non-destructive to the microphones under test, and is reliable and repeatable, even when the test set-up is disassembled and reassembled several times.

Another object of the present invention is to provide such a test set-up and method which provides a smooth response to measured magnitude and phase without extreme variations, especially at higher frequencies.

Still another object of the present invention is to provide such a test set-up and method capable of handling various microphone types and shapes, including both ECM-style and MEMS-style microphones.

A further object of the present invention is to provide such a test set-up and method capable of measuring the relative frequency response of microphones over at least the frequency range of 100 Hz to 8,000 Hz.

A still further object of the present invention is to provide such a test set-up and method that is relatively simple to prepare and conduct, allowing such measurements to be completed in less than 30 minutes.

Yet a further object of the present invention is to provide such a test set-up and method which minimizes any changes in the acoustic field, while maintaining a consistent propagation path, when alternating between measurements of frequency response of first and second microphones.

Another object of the present invention is to provide such a test set-up and method capable of performing such relative frequency response measurements even when two or more microphones are mounted deep inside an outer housing of an audio product.

These and other objects of the invention will become more apparent to those skilled in the art as the description of the present invention proceeds.

SUMMARY OF THE INVENTION

Briefly described, and in accordance with a preferred embodiment thereof, the present invention relates to an apparatus for measuring the phase and magnitude differences between first and second microphones in response to an excitation signal issued by an audible signal source. A microphone carrier is mounted for rotation about an axis of rotation. The rotatable microphone carrier has a mounting surface for supporting first and second microphones under test; preferably, the mounting surface of the microphone carrier is smooth to minimize any diffraction of the excitation signal. The microphone carrier also has a smooth opposing surface opposite the mounting surface. The microphone carrier can be supported proximate to an audible signal source.

First and second apertures, symmetric about the axis of rotation, extend through the microphone carrier from the mounting surface to the smooth opposing surface; ideally, both the first and second symmetrical apertures are circular in cross-section. These first and second symmetrical apertures lie substantially co-linear with, and on opposite sides of, the axis of rotation of the microphone carrier, and are equidistant therefrom. A first portion of the mounting surface surrounding the first symmetrical aperture is adapted to sealingly receive the first microphone, while a second portion of the mounting surface surrounding the second symmetrical aperture is adapted to sealingly receive the second microphone. Preferably, the first microphone is sealingly mounted to the mounting surface to cover the first symmetrical aperture, while the second microphone is sealingly mounted to the mounting surface to cover the second fixed symmetrical aperture.

During testing, an audible signal source is preferably disposed proximate to the microphone carrier for issuing an excitation signal across its smooth opposing surface. The microphone carrier can initially be rotated to a first position for placing the first microphone closest to the audible signal source, and the second microphone furthest from the audible signal source, in order to measure the excitation signal received by each of the first and second microphones. Thereafter, the microphone carrier can be rotated 180 degrees to a second position for placing the second microphone closest to the audible signal source, and the first microphone furthest from the audible signal source, and the responses of the respective microphones to the excitation signal are measured again.

It is preferred that the microphone carrier is of the form of a generally circular disk having an outer perimeter, and that the first and second apertures be located closer to the axis of rotation of the microphone carrier than to its outer perimeter.

To aid in positioning and sealing the first microphone against the mounting surface of the microphone carrier, in alignment with the first symmetrical aperture, a first gasket is provided. The first gasket includes an opening for alignment with the first symmetrical aperture. The first gasket is placed against the mounting surface for forming a seal between the mounting surface and the first microphone, while the opening of the first gasket allows the excitation signal to pass through the first symmetrical aperture to the first microphone. Similarly, a second gasket is also provided, having an opening for alignment with the second symmetrical aperture. The second gasket is placed against the mounting surface for forming a seal between the mounting surface and the second microphone, while the opening of the second gasket allows the excitation signal to pass through the second symmetrical aperture to the second microphone. Preferably, the openings formed in the first and second gaskets have the same general shape as the first and second microphones for receiving the first and second microphones within such openings. The first and second gaskets may each be formed of an elongated sheet of resilient compressible material extending between first and second opposing ends. Preferably, the microphone-receiving opening formed in each such gasket is disposed closer to a first end of each elongated sheet than to the opposing second end, thereby allowing a user to manipulate the second end of each elongated sheet to align the microphone received within its opening with one of the symmetrical apertures of the microphone carrier. To facilitate such alignment, the microphone carrier is preferably formed of a translucent material for allowing a user to visualize the first and second microphones, and to visualize the first and second gaskets, through the smooth opposing surface of the microphone carrier.

In regard to another aspect of the present invention, a testing apparatus is provided for measuring the phase and magnitude differences between at least first and second microphones each mounted within the housing of an audio device. First and second apertures are formed within the outer housing of the audio device, corresponding to locations at which the first and second microphones are situated.

The testing apparatus includes a mounting plate having a mounting surface and having a smooth opposing surface opposite the mounting surface. The mounting plate is configured to be placed near an audible signal source. An aperture is provided within the mounting plate, extending from the mounting surface to the smooth opposing surface. A gasket is also provided, the gasket being placed against the mounting surface for forming a seal between the mounting surface and the outer housing of the audio device under test. The gasket includes an opening for alignment with the aperture of the mounting plate.

The aforementioned testing apparatus also includes a clamp configured to physically support the audio device at a desired angular position, and further includes a jack coupled to the clamp for selectively urging the clamp, and the device supported thereby, toward the gasket and the mounting surface. The jack may be manipulated to initially urge the outer housing of the audio device against the gasket and mounting surface for aligning the first aperture of the audio device with the aperture formed in the mounting plate and the opening in the gasket. Measurements can then be taken of the excitation signal received by the first microphone. Thereafter, the clamp and jack can be reconfigured to urge the outer housing of the audio device against the gasket and mounting surface, but now aligning the second aperture of the audio device with the aperture formed in the mounting plate and the opening in the gasket. Measurements can then be taken of the excitation signal received by the second microphone. The results of such measurements can then be used to calibrate the relative frequency response as between the first and second microphones.

As mentioned above, the present invention also relates to a method for measuring the phase and magnitude differences between first and second microphones in response to an excitation signal issued by an audible signal source. In practicing such method, a microphone carrier is provided, wherein the microphone carrier has a mounting surface for supporting first and second microphones and has a smooth opposing surface opposite the mounting surface. In addition, first and second symmetrical apertures are provided within the microphone carrier spaced from each other, each extending through the microphone carrier from the mounting surface to the smooth opposing surface. Preferably, the method includes the step of rotatably supporting the microphone carrier about an axis of rotation; in that instance, the first and second symmetrical apertures are preferably formed to be substantially co-linear with, and lying on opposite sides of, the axis of rotation of the microphone carrier, and equidistant from its axis of rotation.

The aforementioned method also includes the steps of sealingly mounting the first microphone against a portion of the mounting surface surrounding the first symmetrical aperture to cover the first fixed symmetrical aperture, and sealingly mounting the second microphone against a portion of the mounting surface surrounding the second symmetrical aperture to cover the second symmetrical aperture. Preferably, this step includes inserting a first gasket against the mounting surface for forming a seal between the mounting surface and the first microphone, and aligning an opening of the first gasket with the first symmetrical aperture to allow the excitation signal to pass through the first symmetrical aperture to the first microphone. Similarly, the step of inserting a second gasket against the mounting surface for forming a seal between the mounting surface and the second microphone may also be performed, wherein an opening of the second gasket is aligned with the second symmetrical aperture to allow the excitation signal to pass through the second symmetrical aperture to the second microphone.

It is preferred that the step of sealingly mounting the first microphone against the mounting surface of the microphone carrier is performed by providing an elongated sheet of resilient compressible material extending between first and second opposing ends. A hole is formed within such sheet proximate to its first end for receiving the first microphone. A foam block is then applied over the first microphone, and over the first end of the elongated sheet; the foam block is secured to the microphone carrier to loosely retain the first microphone, and the first end of the elongated sheet, against the mounting surface of the microphone carrier, while leaving the second end of the elongated sheet exposed. The second end of the elongated sheet is then manipulated to properly align the first microphone relative to the first symmetrical aperture before firmly clamping the foam block against the mounting surface of the microphone carrier.

The microphone carrier is initially oriented in a first orientation to position the first symmetrical aperture relatively close to the audible signal source, and the excitation signal received by the first microphone is measured. The microphone carrier is then re-oriented to a second orientation to position the second symmetrical aperture relatively close to the audible signal source, and the excitation signal received by the second microphone is measured. Based upon the measurements made for the first and second microphones when the microphone carrier is at its first and second orientations, respectively, the phase and magnitude differences between the first and second microphones are derived.

In the case wherein the microphone carrier is rotatably supported about an axis of rotation, the aforementioned step of re-orienting the microphone carrier to position the second symmetrical aperture relatively close to the audible signal source includes the step of rotating the microphone carrier 180 angular degrees from its initial position corresponding to the first symmetrical aperture being relatively close to the audible signal source.

In practicing the foregoing method, it may be advantageous to measure the excitation signal received by each of the first and second microphones when the microphone carrier is oriented at its first orientation, and to measure the excitation signal received by each of the first and second microphones when the microphone carrier is oriented at its second orientation. The step of deriving phase and magnitude differences between the first and second microphones may then be based upon the measurements acquired for both the first and second microphones at both the first and second orientations of the microphone carrier.

As was also described above, another aspect of the present invention is to provide a method for measuring the phase and magnitude differences between at least first and second microphones that are mounted inside an audio device having an outer housing. In such instances, the outer housing of the audio device typically has first and second apertures formed therein, corresponding to locations at which first and second microphones are situated. In practicing this method, a mounting plate is provided having a mounting surface for engaging the outer housing of the audio device; the mounting plate includes a smooth opposing surface opposite the mounting surface. An aperture is provided in the mounting plate, extending from the mounting surface to the smooth opposing surface. An audible signal source is provided for issuing an excitation signal proximate to the smooth opposing surface of the mounting plate.

The audio device under test is then positioned into a first position wherein the first aperture of its outer housing is urged against the mounting surface of the mounting plate in alignment with the aperture of the mounting plate. For example, a jack may be used to selectively push the audio device against the mounting surface. Preferably, as the first aperture in the outer housing of the audio device is urged against the mounting surface of the mounting plate, a seal is formed about the first aperture of the outer housing of the audio device and the aperture of the mounting plate. The excitation signal received by the first microphone of the device is then measured.

Thereafter, the audio device is re-positioned into a second position in which the second aperture of the outer housing of the audio device is urged against the mounting surface of the mounting plate in alignment with the aperture in the mounting plate. It is again preferred that, as the second aperture in the outer housing of the audio device is urged against the mounting surface of the mounting plate, a seal is formed about the second aperture of the outer housing of the audio device and the aperture of the mounting plate. The excitation signal received by the second microphone of the device when the device is positioned in its second position is likewise measured. Phase and magnitude differences as between the first and second microphones are then derived based upon the measurements acquired with the audio device at its first and second positions.

DETAILED DESCRIPTION OF THE PREFERRED EMBODIMENTS

Figure 1:
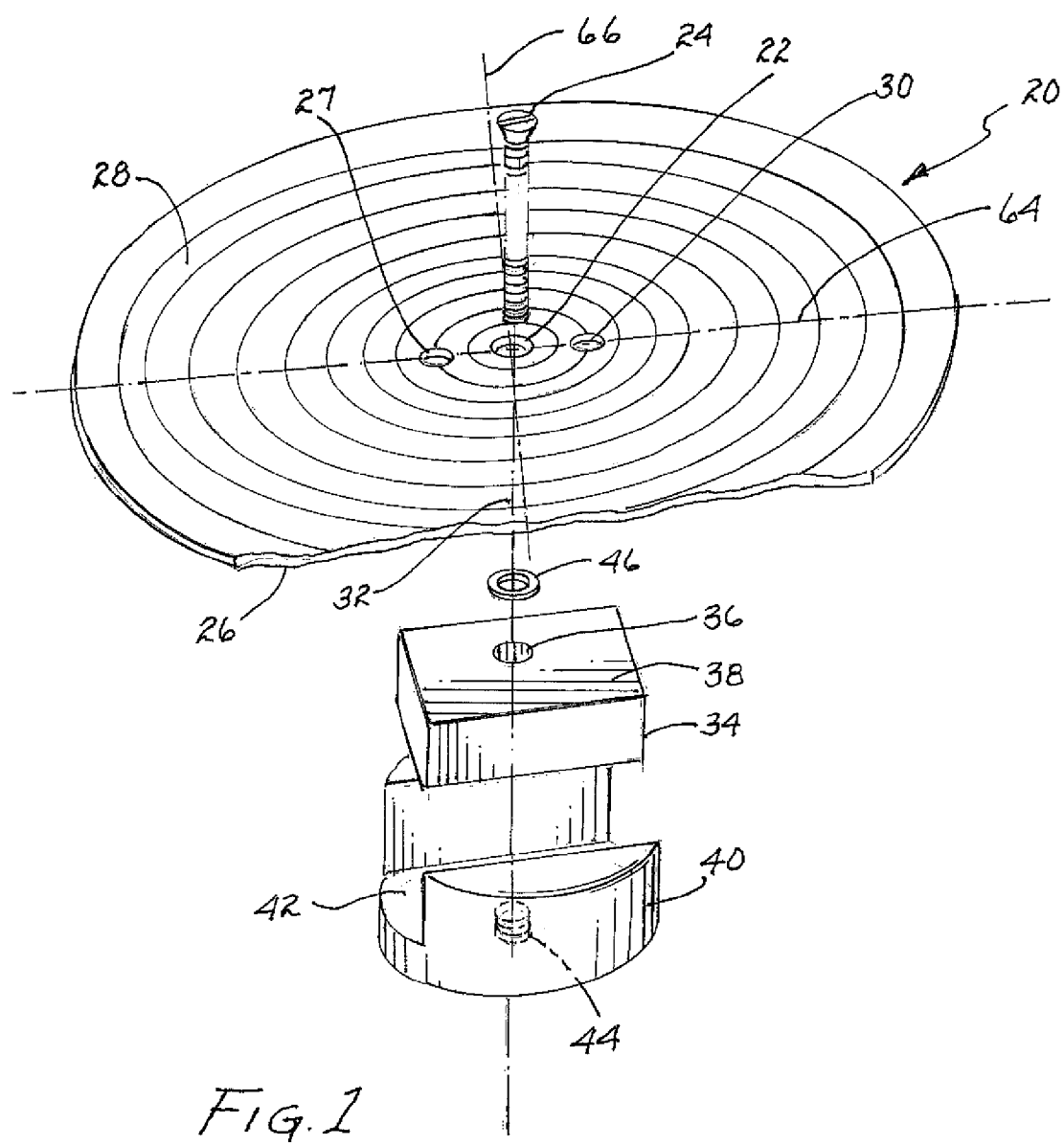
FIG. 1 is a perspective view of a microphone carrier plate used to support a pair of microphones under test.

A preferred form of apparatus for measuring the phase and magnitude differences between first and second microphones in response to an audible excitation signal includes a microphone carrier plate as designated generally in FIG. 1 by reference numeral 20. Carrier plate 20 is a circular plate or disk, and is preferably formed of transparent or translucent material, for reasons which will be explained below. A disk shape is preferred to maintain uniform and symmetric diffractions of sound signals around the edges of carrier plate 20 in order to capture consistent data at different rotation angles. Preferably, carrier plate 20 has a radius measuring approximately 80 mm, and is made of either clear acrylic or Lexan-brand plexiglass. Carrier plate 20 includes a central hole 22 for receiving the shaft of retaining screw 24. Carrier plate 20 includes a generally planar lower mounting surface 26 for supporting first and second microphones (not shown in FIG. 1), and a smooth opposing upper surface 28 opposite lower mounting surface 26. Preferably, central hole 22 is beveled to fully receive the head of retaining screw 24, whereby the head of retaining screw 24 lies essentially in the same plane as upper surface 28. Flush mounting of the head of retaining screw 24 helps to avoid interference with the acoustic field along the upper surface 28 of carrier plate 20. Carrier plate 20 is attached firmly to retaining screw 24 using a disk locknut 46 to prevent carrier plate 20 from spinning around retaining screw 24. Preferably, disk locknut 46 has a round shape to provide clearance for microphone holders to be described below.

First aperture 27 is formed in carrier plate 20 a predetermined distance from central hole 22 and extends through carrier plate 20 from upper surface 28 down to mounting surface 26. First aperture 27 permits an audible excitation signal to pass therethrough to a first microphone (not shown in FIG. 1). Likewise, a second aperture 30 is formed in carrier plate 20 the same predetermined distance from central hole 22, but on the opposite side of central hole 22 as first aperture 27, and extends through carrier plate 20 from upper surface 28 down to mounting surface 26. Both apertures 27 and 30 are essentially cylindrical, circular in cross-section, and symmetrical. First aperture 27 and second aperture 30 are substantially co-linear with, and lie on opposite sides of, central hole 22. As will be described below, central hole 20 corresponds to an axis of rotation 32 of microphone carrier plate 20, and first aperture 27 and second aperture 30 are equidistant from axis of rotation 32. It is preferred that apertures 27 and 30 each lie closer to the central axis of rotation 32 than to the outer perimeter of carrier plate 20.

First aperture 27 permits an audible excitation signal transmitted near upper surface 28 of carrier plate 20 to pass downwardly therethrough to a first microphone (not shown in FIG. 1). Similarly, second aperture 30 permits the audible excitation signal to pass downwardly therethrough to a second microphone (not shown in FIG. 1). Preferably, first and second apertures 27 and 30 are spaced approximately 15 mm from each other, and each is spaced approximately 7.5 mm from axis of rotation 32. In the preferred embodiment, the inner diameter of first and second apertures 27 and 30 is approximately 3 mm.

Still referring to FIG. 1, a foam block 34 has a central hole 36 formed therethrough for receiving the shaft of retaining screw 24. Foam block 34 includes an upper surface 38 which is ultimately clamped against mounting surface 26 of carrier plate 20 to secure first and second microphones to carrier plate 20. Foam block 34 is preferably formed of a collapsible piece of foam and is also referred to herein as a conformal retainer. Foam block 34 is placed underneath the microphones under test. A closed-cell type foam is preferred over an open-cell type foam to avoid leakage of sound waves from the bottom of carrier plate 20. Foam block 34 serves as an acoustic barrier to prevent sound signals from reaching the microphones under test other than through apertures 27 and 30.

Also shown in FIG. 1 is a bottom clamp 40, preferably formed of aluminum. Clamp 40 is generally cylindrical, but has a rectangular channel 42 formed therein for receiving the lower portion of foam block 34. Bottom clamp 40 has a central aperture 44 for allowing the lower end of the shaft of retaining screw 24 to extend therethrough. The purpose of foam block 34 is to hold first and second microphones in position against mounting surface 26 of carrier plate 20 by transferring force from bottom clamp 40 in a non-destructive manner. Foam block 34 will modify its shape under pressure to conform to different shapes and sizes of particular microphones under test. The flexibility of such collapsible foam allows for testing of microphones of different heights and styles.

Figure 2:
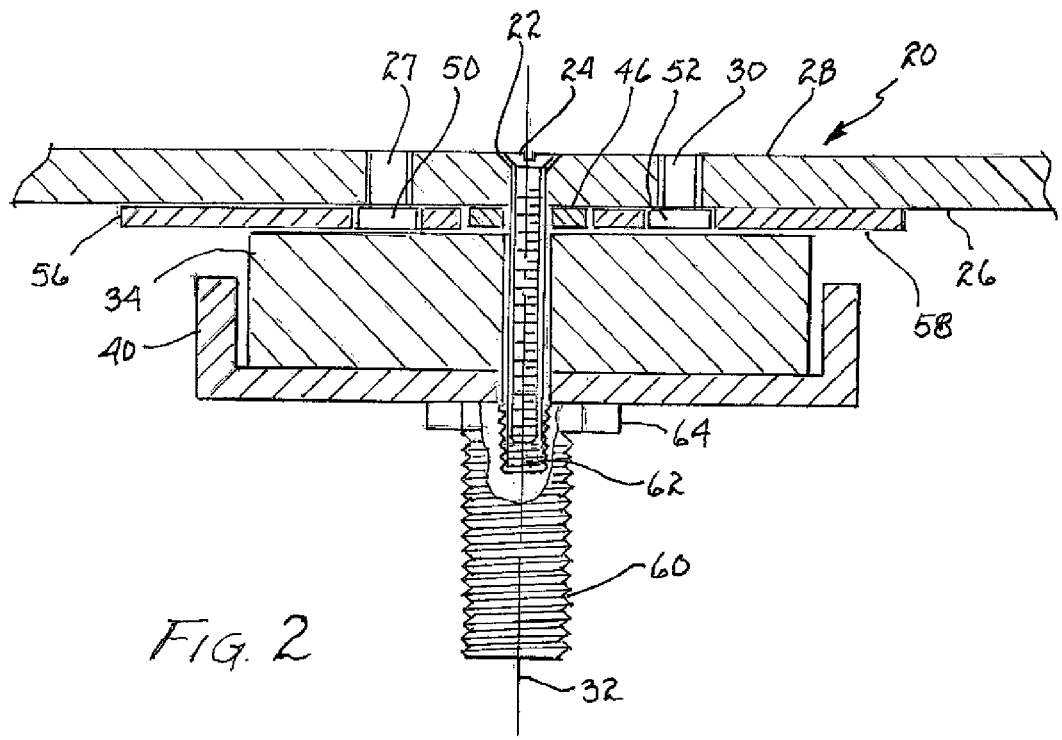
FIG. 2 is a cross-sectional view of the microphone carrier plate with first and second microphones secured thereto.
Figure 3:
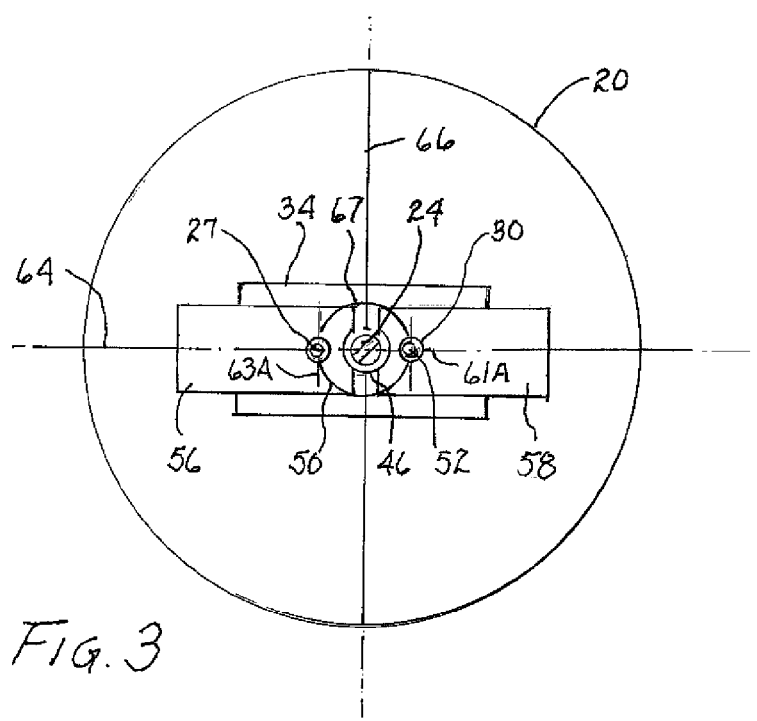
FIG. 3 is a top view of the microphone carrier plate shown in FIGS. 1 and 2.
Figure 5:
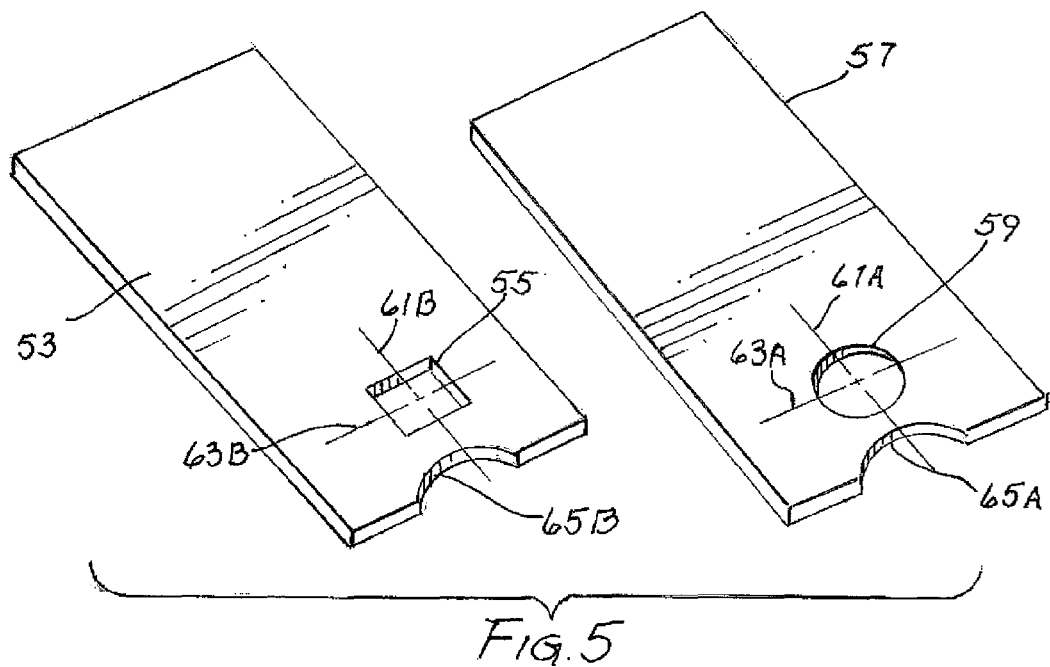
FIG. 5 is a perspective view of a pair of gasket strips used to receive and align a pair of microphones.

Turning to FIG. 2, the carrier plate 20, foam block 34, and bottom clamp 40 are shown in a cross-sectional side view, along with first microphone 50 and second microphone 52. First microphone 50 is positioned against mounting surface 26 of carrier plate 20, directly below first aperture 27 and covering such aperture. Second microphone 52 is also positioned against mounting surface 26 of carrier plate 20, directly below second aperture 30 and covering such aperture. The first and second microphones under test, i.e., microphones 50 and 52, are placed in microphone holders 56 and 58. Examples of such microphone holders are shown in FIG. 5, wherein microphone holder 53 has a square-shaped hole 55 formed near one end thereof for receiving a square-shaped microphone, and microphone holder 57 has a circular hole 59 formed near one of its ends for receiving a circular-shaped microphone. Each such microphone holder is preferably custom-made for each microphone's unique size and shape. Preferably, such microphone holders are made from sheets of resilient compressible gasket material. During use, the holes formed in microphone holders 56 and 58 are aligned with apertures 27 and 30 for allowing sound passing through such apertures to reach microphones 50 and 52. The openings formed in microphone holders for receiving microphones 50 and 52 are disposed closer to one end of the elongated sheet than the other. This allows a user to manipulate the second end of each elongated sheet to align the microphone received therein with the respective aperture (27/30) of carrier plate 20. Also, as shown in FIGS. 3 and 5, indexing marks 61A/63A and 61B/63B may be formed on microphone holders 57/53, respectively, extending at right angles to each other, and intersecting at the center of holes 59/55, respectively, to aid in alignment of holes 59/55 with the corresponding apertures 27/30 in plate 20. In addition, as shown in FIGS. 3 and 5, each of such microphone holders has a circular cut-out 65A/65B at its end closest to its microphone hole for allowing such microphone holders to abut the outer perimeter of disk locknut 46, if desired.

Referring again to FIG. 2, and also FIG. 3, microphone holder 56 forms an acoustic seal around microphone 50 relative to mounting surface 26 of carrier plate 20. Similarly, microphone holder 58 forms an acoustic seal around microphone 52 relative to mounting surface 26 of carrier plate 20. In addition, microphone holders 56 and 58 provide a simple and convenient mechanism to properly position and align microphones 50 and 52 with the respective first and second apertures 27 and 30 in carrier plate 20. Before tightening bottom clamp 40, one may manipulate the distal ends of microphone holders 56 and 58, which project outwardly from foam block 34, until each microphone (50/52) is centered below its respective aperture (27/30).

It was earlier mentioned that carrier plate 20 is preferably formed of a material that is transparent or translucent. This is because a user, looking downwardly at upper surface 28 of carrier plate 20 (see FIG. 3) may then simultaneously view microphones 50/52, microphone holders 56/58, and apertures 27 and 30, to facilitate precise alignment of microphones 50 and 52 with apertures 27 and 30, respectively. Thus, microphone holders 56 and 58 serve as both acoustic gaskets and as positioning mechanisms for aligning microphones 50 and 52 with apertures 27 and 30. Moreover, as indicated in FIG. 5, the use of two microphone holders 56 and 58 allows for concurrent testing of two microphones having two different shapes from each other. The use of such microphone holders avoids the need for installation of custom made "boots", and also facilitates flush mounting of microphones 50 and 52 below carrier plate 20, against mounting surface 26, in essentially the same manner as each other; this helps insure that the propagation paths to each microphone are as identical as possible.

Within FIG. 3, line 64 is printed upon the upper surface of carrier plate 20 and indicates a diametrical line extending through the center of carrier plate 20, and passing through both the centers of apertures 27 and 30. Line 66 is also preferably printed upon the upper surface of carrier plate 20 and indicates a perpendicular axis passing through the center of carrier plate 20 and forming a right angle with diametrical line 64. Lines 64 and 66 assist a user in accurately determining the angular orientation of carrier plate 20, and for aligning the microphones in the sound field during testing. Also printed upon the upper surface of carrier plate 20 is a circular ring 67 that is centered upon the axis of rotation of carrier plate 20 (corresponding in FIG. 3 with the intersection of alignment lines 64 and 66) and having a diameter equal to the spacing between apertures 27 and 30. When aligning microphone holders 56 and 58 with carrier plate 20 (thereby aligning microphones 50 and 52 with apertures 27 and 30), a user may easily match-up indexing lines 61A/63A and 61B/63B (see FIG. 5) with reference line 64 and ring 67 printed on carrier plate 20 to achieve proper alignment of microphones 50 and 52 with corresponding apertures 27 and 30.

After a user confirms that microphones 50 and 52 are properly aligned with apertures 27 and 30, bottom clamp 40 is tightened to apply upward force on foam block 34. Foam block 34 is compressed against microphones 50/52 and the inner portions of microphone holders 56 and 58 to effectively seal off such microphones, with the exception of any sound signals entering apertures 27 and 30. Compressive force is applied by bottom clamp 40 to foam block 34 by retaining screw 24, and by the head of clamp screw 60. Clamp screw 60 is somewhat larger in diameter than the shaft of retaining screw 24. As shown in FIG. 2, the head 64 of clamp screw 60 includes an internally-threaded bore 62 for receiving the lower end of retaining screw 24. As retaining screw 24 is tightened within bore 62 of head 64, head 64 bears against bottom clamp 40, forcing it toward carrier plate 20. The pressure thereby applied by foam block 34 ensures that sound waves reach the diaphragms of microphones 50 and 52 only through apertures 27 and 30, respectively, and not from the sides. As shown in FIG. 2, clamp screw 60 extends along rotational axis 32.

Figure 4:
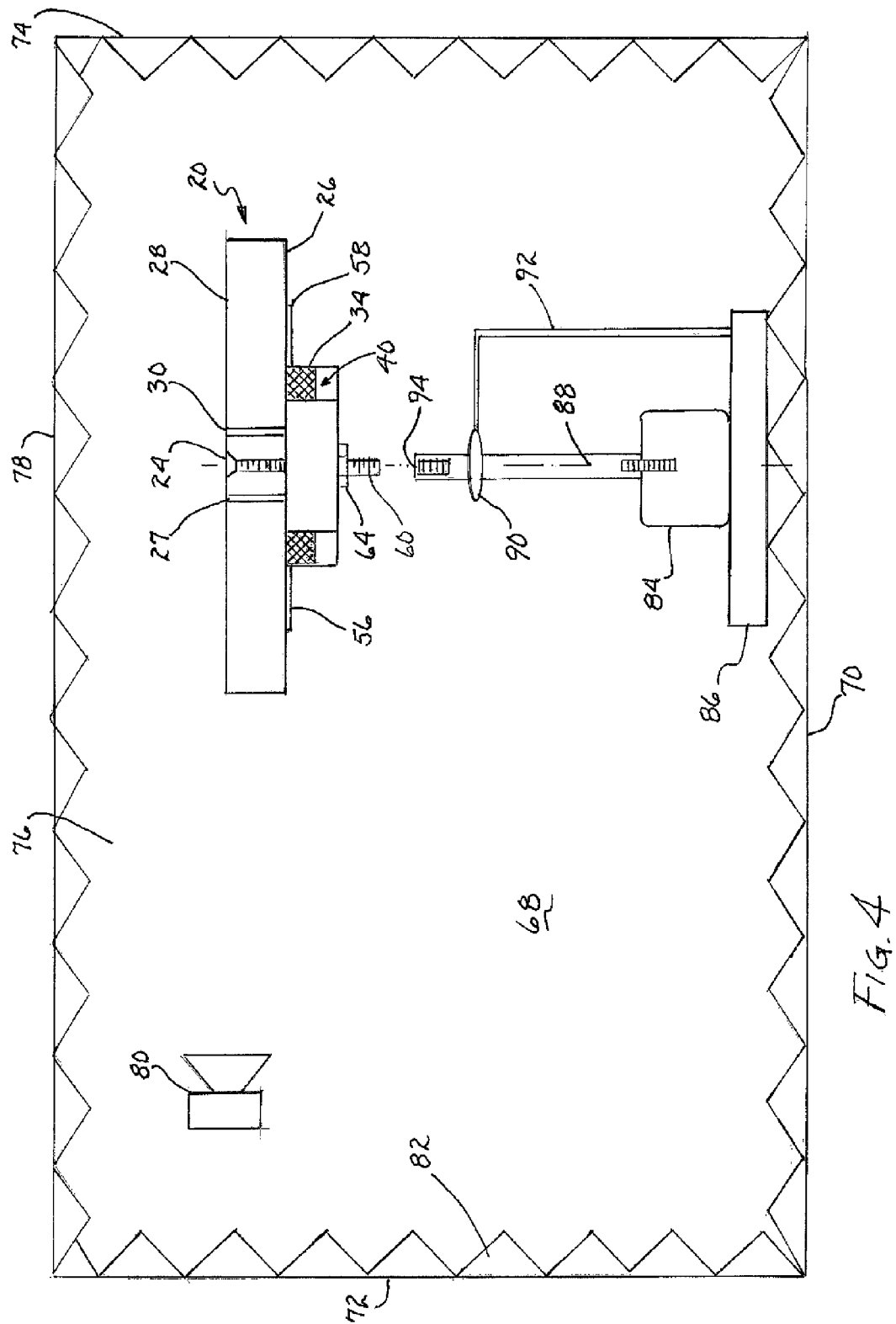
FIG. 4 is a side view of a test chamber in which the microphone carrier plate of FIG. 1 has been placed for taking measurements.

Now referring to FIG. 4, the assembly of FIG. 3 is placed inside an anechoic chamber 68 to generate a consistent acoustic field with very little ambient acoustic noise. Chamber 68 may take the form of a boxed enclosure with a door formed by one of the four sidewalls (e.g., the front-most wall relative to FIG. 4) for inserting and removing carrier plate 20. As shown in FIG. 4, anechoic chamber 68 includes a floor 70, opposing end walls 72 and 74, back wall 76, and top 78. Loudspeaker 80 is mounted within chamber 68 to play audio excitation signals; loudspeaker 80 is preferably spaced approximately 360 mm from the closest edge of carrier plate 20 and sends the excitation signal across the smooth upper surface 28 of carrier plate 20. The sidewalls, floor and top of chamber 68 are preferably acoustically treated by sound-absorbing layer 82 (e.g., anechoic wedges).

Still referring to FIG. 4, a programmable stepper motor 84 is supported upon a rigid base platform 86. Elongated cylindrical shaft 88 extends upwardly from stepper motor 84. The angle of rotation of shaft 88 is controlled by stepper motor 84, and can be programmed via a connection to a personal computer (not shown). Shaft 88 is partially supported by a stabilizer bearing assembly 90, in turn, supported by bracket 92. Stabilizer bearing assembly aids in preventing shaft 88 from bending or tilting out of a vertical axial alignment. The uppermost end of shaft 88 includes an internally-threaded bore 94 for threadedly engaging the lower end of clamp screw 60.

When preparing to make measurements, the microphones 50 and 52 under test are first positioned below carrier plate in the manner described above. After properly aligning microphones 50 and 52 with apertures 27 and 30, retaining screw 24 is tightened into the head of clamp screw 60 to firmly secure foam block 34 against the undersides of the microphones, against microphone holders 56 and 58, and against mounting surface 26, to eliminate acoustic leakage paths. Carrier plate 20 is then mounted upon stepper motor rotation shaft 88 by threadedly engaging clamp screw 60 therewith, thereby allowing carrier plate 20 to be rotated about rotation axis 32.

Figure 6A:
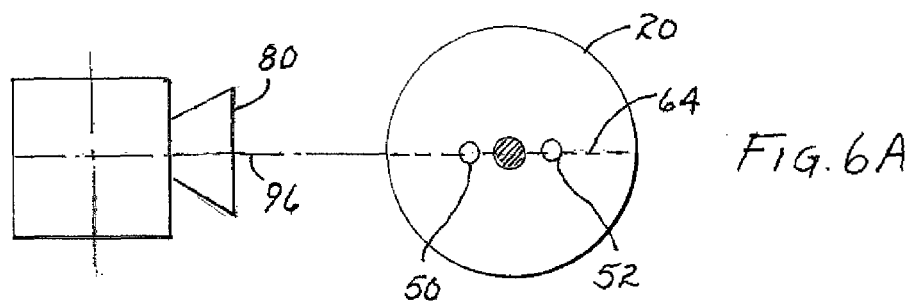
FIGS. 6A and 6B are schematic drawings showing two alternate test positions for taking frequency response measurements of first and second microphones, one test position being rotated 180 degrees relative to the other.

As shown in FIG. 6A, the starting position of stepper motor shaft 88 is adjusted such that microphone axis 64 (see FIG. 3) is aligned to the center axis 96 of loudspeaker 80. Microphone 50 is initially positioned closer to loudspeaker 80, and microphone 52 is initially positioned furthest from loudspeaker 80. A spectrally flat (so-called "white") excitation signal is then played through loudspeaker 80. Two microphone signals, designated $x_{11}(t)$ and $x_{21}(t)$ are acquired in this position, one for microphone 50 and the other for microphone 52, representing the frequency response of each microphone. While not shown in FIG. 4, a pair of wires extends from each microphone under test for taking such measurements; those wires are guided through small openings in chamber 68 for allowing such measurements to be recorded.

Figure 6B:
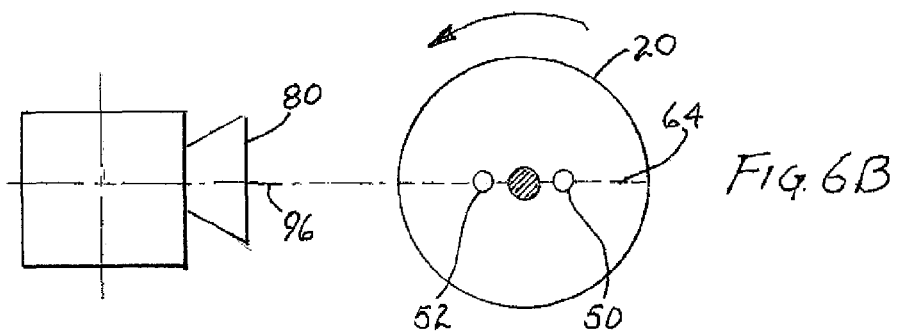

Thereafter, stepper motor 84 is operated to rotate shaft 88, and carrier plate 20, exactly 180 degrees, so that as shown in FIG. 6B, microphone 52 now lies closest to loudspeaker 80, and microphone 50 now lies furthest from loudspeaker 80. The excitation signal is again played by loudspeaker 80, and the responses of the two microphones are again recorded. Carrier plate 20 is maintained in a horizontal plane throughout its rotation, always lying perpendicular to rotator shaft 88. Also, apertures 27 and 30 are precisely drilled to ensure that they are aligned with the center of carrier plate 20 and equidistant therefrom. Accordingly, in regard to FIG. 6B, microphone 52 now lies in precisely the same spatial position as was true for microphone 50 in the initial test shown in FIG. 6A. Similarly, in regard to FIG. 6B, microphone 50 now lies in precisely the same spatial position as was true for microphone 52 in FIG. 6A. Use of the stepper motor to swap positions of the microphones allows for measurement of the sound pressure at the same spatial point by both microphones without perturbing the acoustic field. Two more microphone signals $X_{12}(t)$ and $X_{22}(t)$ are acquired in the rotated position shown in FIG. 6B.

If a signal x(t) is played through a loudspeaker, the frequency response of the received signal y(t) acquired using a microphone amplified by a preamplifier can be written as:

$$Y(f) = X(f) H_L(f) H_{pp}(f) H_m(f) H_{pa}(f)$$

wherein $H_L(f)$ is the frequency response of the loudspeaker; $H_{pp}(f)$ models the acoustic propagation path from the loudspeaker to the microphone; $H_m(f)$ is the frequency response of the microphone; and $H_{pa}(f)$ is the frequency response of the preamplifier. If two microphones are tested for frequency response, using the same loudspeaker, the same propagation path, and the same preamplifier, then the relative frequency response, or $H_d(f)$ of the two microphones can be expressed as a ratio wherein the frequency responses of the loudspeaker, propagation path, and preamplifier cancel each other out, leaving:

$$H_d(f) = H_{m1}(f) / H_{m2}(f)$$

wherein $H_{m1}(f)$ represents the frequency response of the first microphone, and $H_{m2}(f)$ represents the frequency response of the second microphone. The above equation can be rewritten to separately set forth the magnitude and phase responses of the two microphones as follows:

$$H_d(f) = \left|\frac{H_{m1}(f)}{H_{m2}(f)}\right| e^{j(\Phi_{m1}(f) - \Phi_{m2}(f))}$$

wherein $H_{m1}(f)$ and $H_{m2}(f)$ represent the magnitude of the responses of the first and second microphones as a function of frequency, and $\Phi_{m1}$ and $\Phi_{m2}$ represent the phase responses of the first and second microphones as a function of frequency.

With reference to FIGS. 6A and 6B, the relative frequency response estimate for microphones 50 and 52 can be obtained by averaging the measurements obtained from both of the positions (i.e., the first position shown in FIG. 6A, and the second position shown in FIG. 6B). Specifically, $$H_{d1}(f) = \left|\frac{X_{11}(f)}{X_{22}(f)}\right| e^{j(\Phi_{11}(f) - \Phi_{22}(f))},$$

$$H_{d2}(f) = \left|\frac{X_{12}(f)}{X_{21}(f)}\right| e^{j(\Phi_{12}(f) - \Phi_{21}(f))},$$

$$\hat{H}_d(f) = \frac{1}{2}[H_{d1}(f) + H_{d2}(f)] = |\hat{H}_d(f)| e^{j\hat{\Phi}_d(f)}$$

where $X_{ij}(f)$ is the power spectral density of microphone i at $j^{th}$ measurement and $\hat{H}_d(f)$ is the relative frequency response estimate between the two microphones under test. In this manner, phase and magnitude differences between the first and second microphones may be derived, and appropriate compensation schemes may be implemented within the audio device that will be using such microphones.

It should be understood that, while the test apparatus shown in FIG. 4 may induce certain diffraction effects, such diffraction effects will not affect the final result because it is the relative frequency response between the two microphones that is being measured. This is true provided that the acoustic field remains the same between these two measurements. As described above, small changes in a physical set up between two successive measurements can alter the acoustic field. For example, the acoustic field can change when the first microphone is manually replaced by the second microphone in the measurement set up. A small change in the apparatus position between the two measurements can also introduce different diffraction patterns, thereby affecting the acoustic field at the sensing point. However, the rotating carrier plate/stepper motor technique described above reduces measurement error variations by placing both microphones in the test chamber before testing begins, taking measurements from both microphones without disturbing the physical set up, and by successively placing both microphones at the same spatial point to sense the sound pressure at the very same point.

Figure 7:
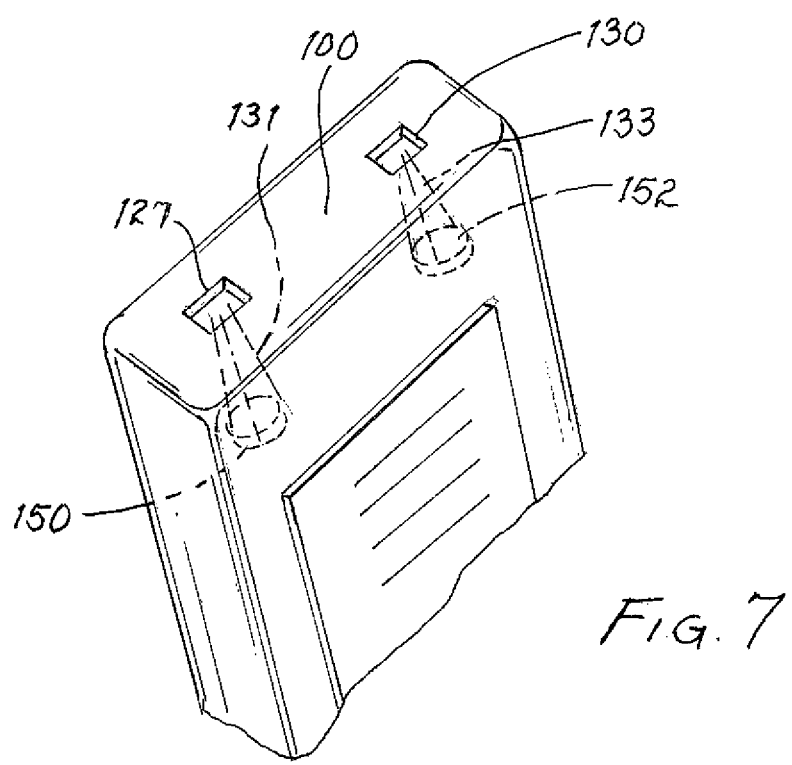
FIG. 7 is a perspective view of an audio device having an outer housing with first and second apertures for guiding sound to first and second microphones disposed within such outer housing.

The test set-up and related method described above with regard to FIGS. 1-6 works well for two discrete microphones. However, as mentioned above, there are instances wherein a pair of microphones is mounted relatively deeply within the housing of an audio product, in which case the relative frequency response of the two microphones will be significantly impacted by their respective propagation paths, even if the two microphones are perfectly matched to each other. For example, FIG. 7 illustrates the upper portion of an audio product 100 having a first microphone 150 and a second microphone 152. The outer housing of audio product 100 includes a first port 127 for sending sounds, along a first propagation path 131, to internal microphone 150 mounted further inside audio product 100. Similarly, second port 130 sends sounds, along a second propagation path 133, to internal microphone 152, also mounted further inside audio product 100. In this case, the only reliable way to determine the relative frequency response of microphones 150 and 152 is to measure the responses of such microphones as installed in audio product 100. In the case of some audio products, the first and second microphone holes may even be located on different surfaces of the housing, and may be pointed in different directions.

Figure 8:
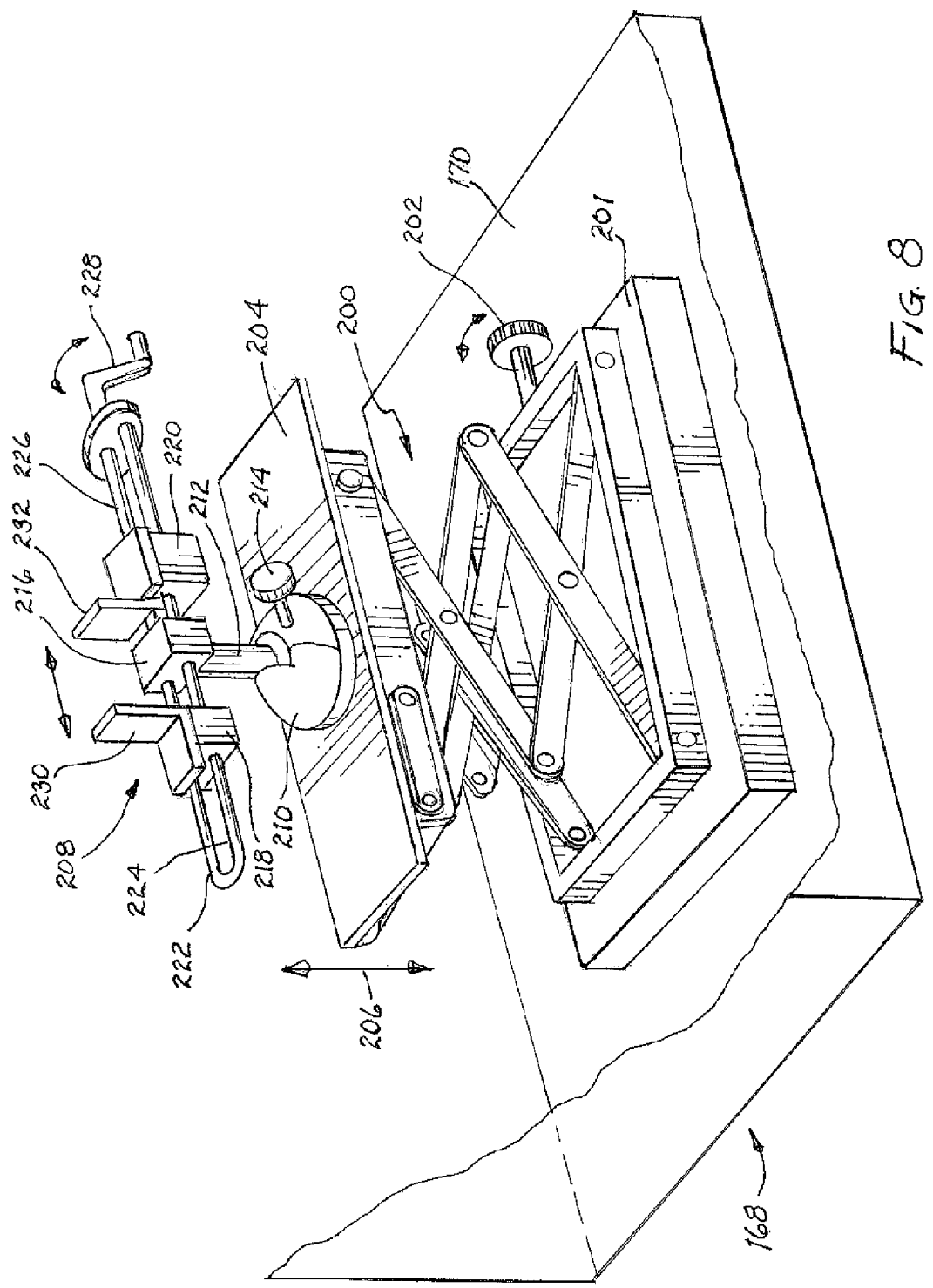
FIG. 8 is a perspective view of a test apparatus including a clamp supported upon an elevation jack for urging an audio device toward an upper mounting plate.
Figure 9:
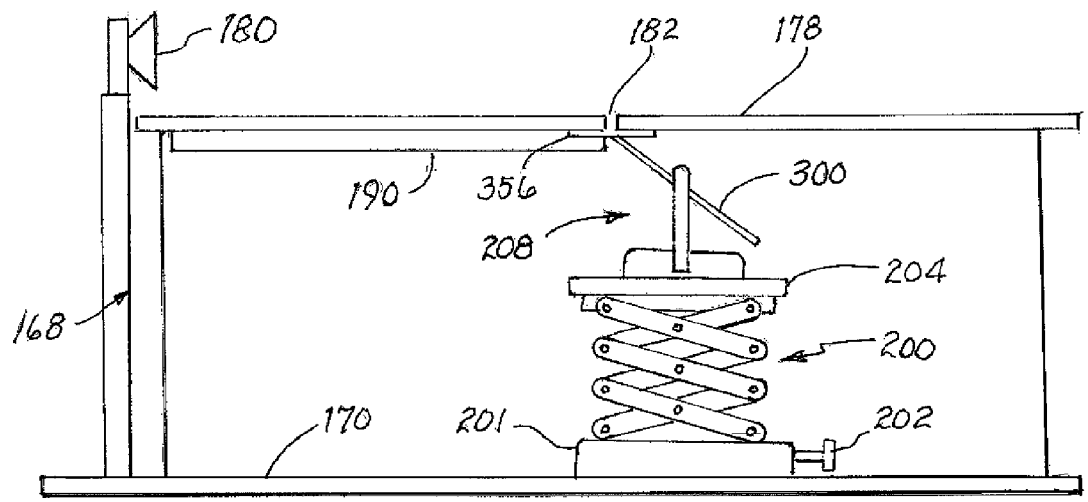
FIG. 9 is a side view of the apparatus shown in FIG. 8 wherein the audio device of FIG. 7 is held within the clamp for urging one of its first and second apertures into sealing engagement with an aperture of the top plate.

Referring to FIGS. 8 and 9, a test apparatus is shown for use in determining the relative frequency response of two internal microphones while minimizing the influence of the case, or housing, of the audio product 300 when measuring the microphone response. The testing apparatus includes a transparent boxed enclosure, or test chamber, 168, having a door (not shown) formed by one of its sidewalls. The dimensions of chamber 168 are preferably 550 mm in length×350 mm in width×320 mm in height. The three fixed side walls are preferably constructed with 10 mm thick double layered plexiglass. The double layered walls are used to reduce the effects of acoustic vibrations that might otherwise leak into chamber 168. As in the case of chamber 68 shown in FIG. 4, the sidewalls, door, and floor, of chamber 168 are preferably covered with sound absorbing acoustical treatment to suppress extraneous sound waves. Sound is permitted to enter into test chamber 168 only through a hole 182 formed through the top plate 178 Test chamber 168 is constructed in an acoustically sealed manner such that sound originating outside the chamber may only enter the interior of the chamber through top plate hole 182.

Positioned upon floor 170 of test chamber 168 is a lab jack 200. Lab jack 200 is a scissors-action type jack having a rigid base 201. Rotation of height adjustment knob 202 raises or lowers jack platform 204, as indicated by arrows 206. An XY positioner 208 includes a base 210 secured upon jack platform 204. Extending upwardly from base 210 is a stub shaft 212, the lower end of which forms a locking ball joint with base 210. Locking knob 214 may be loosened temporarily to move stub shaft 212 to a desired tilt angle, if needed, and then re-tightened. The upper end of stub shaft 212 is secured to a fixed block 216. Movable blocks 218 and 220 are coupled to fixed block 216 by a pair of slide rods 222 and 224, together with a threaded drive rod 226. Crank handle 228 may be rotated to move blocks 218 and 220 toward, or away from, fixed block 216. L-shaped clamping members 230 and 232 are secured respectively to the tops of movable blocks 218 and 220. Thus, a user can rotate crank 228 to clamp a device under test (300) between clamping members 230 and 232. The height of the device under test can be adjusted via adjustment knob 202 of lab jack 200, and the tilt angle of the audio device under test can be adjusted by unlocking, and manipulating the ball joint formed between stub shaft 212 and base 210, allowing the audio device to tilt to any desired angle in both x and y directions.

Figure 10:
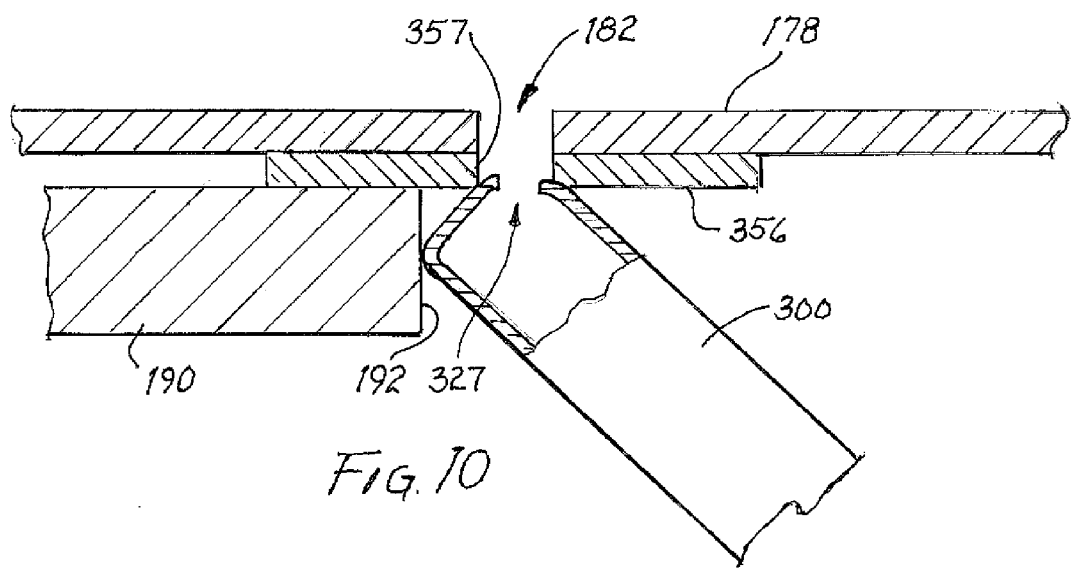
FIG. 10 is an enlarged cross-sectional view of the upper portion of the audio device shown in FIG. 9

As shown in FIGS. 9 and 10, test chamber 168 includes top plate 178 having a top plate hole 182 formed therein. Top plate 178 is preferably made of 5 mm thick plexiglass or conventional glass. Top plate hole 182 preferably has a 3 mm diameter. Within FIGS. 9 and 10, the audio device under test is designated by reference numeral 300, and in FIG. 10, reference numeral 327 designates a port, or microphone hole, in the housing of audio device 300 leading to an internal microphone being measured. It is preferred that top plate 178 be transparent, or translucent, for allowing a user to observe the microphone hole 327 of the audio product 300, relative to top plate hole 182, to achieve precise alignment therebetween. The lower surface of top plate 178 may be regarded as a mounting surface; the upper surface of top plate 178 is preferably smooth and planar.

To obtain reliable measurements, microphone hole 327 (see FIG. 10) of audio product 300 must be placed under top plate hole 182 with a very good seal around such hole. If sound waves were to travel inside test chamber 168 to microphone hole 327, other than through top plate hole 182, large variations in the acoustic field would result which could greatly affect the measured frequency response of a microphone. In order to reduce such leakage paths, a gasket 356, preferably made from a clear silicone, adhesive-backed sheet, is attached directly underneath top plate hole 182. A hole 357 is punched through silicone sheet 356 in alignment with, and of the same diameter as, top plate hole 182. By applying sufficient upward force to audio device 300, as by raising platform 204 of lab jack 200, silicone gasket 356 compresses to provide the necessary acoustic seal between the housing of audio device 300 and top plate 178 adjacent top plate hole 182.

When measurements are to be made of the frequency response of microphones within audio device 300, a loudspeaker 180 is mounted near the top of test chamber 168 to play excitation signals across top plate 178. Loudspeaker 180 is physically separated from test chamber 168 to minimize any mechanical vibrations that might otherwise be coupled to the microphone under test. Audio device 300 is clamped within the jaws of clamp 208 and the position of audio device 300 is adjusted to place the appropriate microphone hole (e.g., microphone hole 327 in FIG. 10) under, and in alignment with, top plate hole 182. The height of lab jack 200 is adjusted to obtain a proper seal between gasket 356 and microphone hole 327. The door to test chamber 168 is then closed, and a spectrally flat excitation signal is played by loudspeaker 180 across top plate 178.

While not shown in the drawing figures, electrical wires extend from audio device 300, and outwardly through acoustically sealed bulkheads in one of the walls of test chamber 168, for allowing the response of the internal microphone to be measured. After measurements are obtained for the first microphone hole, the above-described procedure is repeated, this time positioning a second microphone hole under, and in alignment with, top plate hole 182. Loudspeaker 180 then plays the same excitation signal as before across top plate 178, and measurements are obtained for the second microphone. It is important to note that loudspeaker 180 must remain in the same position during testing of the first microphone and testing of the second microphone. This will insure that the sound pressure produced by loudspeaker 180 at top plate hole 182 is the same sound pressure during measurement of the first microphone as during measurement of the second microphone. The relative frequency response can then be estimated using the method explained above.

The location of the microphone hole in a device can pose many challenges. Sometimes, a proper seal can only be formed between a microphone hole and top plate hole 182 when audio device 300 is standing at a certain slanting angle, as shown for example in FIG. 10. At this slanting angle, the upward force applied from the lab jack to the audio device may cause the audio device to slip away from top plate hole 182 or otherwise compromise the desired seal around top plate hole 182. To mitigate this problem, a retaining member 190 may be secured along top plate 178. Retaining member 190 has a length selected to match the audio device under test, whereby edge 192 of retaining member 190 abuts the housing of audio device 300 to rest against the device under test and prevent it from slipping laterally during the measurement process. The apparatus described above with regard to FIGS. 8-10 appears to be suitable for testing a wide variety of audio products having different shapes, sizes, and microphone hole configurations.

The apparatus and related method described above relative to FIGS. 7-10 of the drawings has assumed that the microphones under test are embedded within a housing of an audio product. Those skilled in the art should appreciate, however, that the same apparatus and method may be used to determine the relative frequency response of two stand-alone microphones, if desired. The first stand-alone microphone can be supported within a test housing (similar to housing 100 shown in FIG. 7) just behind housing aperture 127; the test housing may then be clamped against plate 178 and gasket 356 (see FIGS. 9 and 10), while centering test housing aperture 127 with top plate hole 182 in plate 178 and with aperture 357 of gasket 356. Frequency response measurements of the first microphone are then made. The first microphone is then removed from the test housing, and a second stand-alone microphone is then supported within the same test housing, once again just behind housing aperture 127. The test housing is again clamped against top plate 178 and gasket 356 (see FIGS. 9 and 10), while centering test housing aperture 127 with aperture 182 in plate 178 and with aperture 357 of gasket 356. Frequency response measurements are now taken for the second microphone. This procedure may be repeated for as many separate microphones are used for a given design.

Those skilled in the art will now appreciate that a simple but effective apparatus and method have been described for measuring the phase and magnitude differences between first and second microphones for use in a fixed calibration system of an audio product. The disclosed measurement set-up and related method are non-destructive to the microphones under test. Such measurements can be made reliably and repeatably even after disassembling, and reassembling, the test set-up. The test set-up and methods described above accommodate a wide variety of microphone types and shapes, and allows relative frequency response measurements to be completed easily and quickly. In the case of testing discrete microphones, changes in the acoustic field are avoided, and the propagation path is maintained consistent. Apparatus and methods for reliably measuring relative frequency response between two or more microphones that are mounted deep inside an outer housing of an audio product have also been disclosed above.

While the present invention has been described with respect to preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims.

We claim:

1. An apparatus for measuring the phase and magnitude differences between first and second microphones in response to an excitation signal issued by an audible signal source, comprising:

a) a microphone carrier mounted for rotation about an axis of rotation, the rotatable microphone carrier having a mounting surface for supporting first and second microphones, and the microphone carrier having a smooth opposing surface opposite the mounting surface, the microphone carrier being configured to be placed proximate to an audible signal source;

b) a first symmetrical aperture extending through the microphone carrier from the mounting surface to the smooth opposing surface, a portion of the mounting surface surrounding the first symmetrical aperture being adapted to sealingly receive the first microphone;

c) a second symmetrical aperture extending through the microphone carrier from the mounting surface to the smooth opposing surface, a portion of the mounting surface surrounding the second symmetrical aperture being adapted to sealingly receive the second microphone; and d) the first and second symmetrical apertures being substantially co-linear with, and lying on opposite sides of, the axis of rotation of the microphone carrier, and being equidistant from the axis of rotation;

whereby the microphone carrier may be rotated to a first position for placing the first microphone closest to the audible signal source in order to measure the excitation signal received by each of the first and second microphones when the first microphone is closest to the audible signal source, and whereby the microphone carrier may also be rotated to a second position for placing the second microphone closest to the audible signal source in order to measure the excitation signal received by each of the first and second microphones when the second microphone is closest to the audible signal source.

2. The apparatus recited by claim 1 further including:

a) a first microphone sealingly mounted to the mounting surface to cover the first symmetrical aperture; and b) a second microphone sealingly mounted to the mounting surface to cover the second fixed symmetrical aperture.

3. The apparatus recited by claim 1 further including an audible signal source for issuing an excitation signal across the smooth opposing surface of the microphone carrier.

4. The apparatus recited by claim 1 wherein the mounting surface of the microphone carrier is smooth to minimize diffraction of the excitation signal.

5. The apparatus recited by claim 1 wherein the first and second symmetrical apertures are both circular in cross-section.

6. The apparatus recited by claim 1 wherein the first symmetrical aperture is formed at a first fixed location within the microphone carrier, and wherein the second symmetrical aperture is formed at a second fixed location within the microphone carrier.

7. The apparatus recited by claim 1 wherein the microphone carrier has an outer perimeter relative to its axis of rotation, and wherein the first symmetrical aperture and the second symmetrical aperture lie closer to the axis of rotation than to the outer perimeter.

8. An apparatus for measuring the phase and magnitude differences between first and second microphones in response to an excitation signal issued by an audible signal source, comprising:

a) a microphone carrier mounted for rotation about an axis of rotation, the rotatable microphone carrier having a mounting surface for supporting first and second microphones, and the microphone carrier having a smooth opposing surface opposite the mounting surface, the microphone carrier being configured to be placed proximate to an audible signal source;

b) a first symmetrical aperture extending through the microphone carrier from the mounting surface to the smooth opposing surface, a portion of the mounting surface surrounding the first symmetrical aperture being adapted to sealingly receive the first microphone;

c) a second symmetrical aperture extending through the microphone carrier from the mounting surface to the smooth opposing surface, a portion of the mounting surface surrounding the second symmetrical aperture being adapted to sealingly receive the second microphone;

d) the first and second symmetrical apertures being substantially co-linear with, and lying on opposite sides of, the axis of rotation of the microphone carrier, and being equidistant from the axis of rotation;

e) a first gasket having an opening, the first gasket being placed against the mounting surface for forming a seal between the mounting surface and the first microphone, the opening of the first gasket being aligned with the first symmetrical aperture for allowing the excitation signal to pass through the first symmetrical aperture to the first microphone; and f) a second gasket having an opening, the second gasket being placed against the mounting surface for forming a seal between the mounting surface and the second microphone, the opening of the second gasket being aligned with the second symmetrical aperture for allowing the excitation signal to pass through the second symmetrical aperture to the second microphone;

whereby the microphone carrier may be rotated to a first position for placing the first microphone closest to the audible signal source in order to measure the excitation signal received by each of the first and second microphones when the first microphone is closest to the audible signal source, and whereby the microphone carrier may also be rotated to a second position for placing the second microphone closest to the audible signal source in order to measure the excitation signal received by each of the first and second microphones when the second microphone is closest to the audible signal source.

9. The apparatus recited by claim 8 wherein the first and second microphones each have a predetermined shape, and wherein the first and second openings within the first and second gaskets have the same shapes as the first and second microphones, respectively, the opening formed in the first gasket receiving the first microphone, and the opening in the second gasket receiving the second microphone, each first and second gasket being formed of an elongated sheet of resilient compressible material extending between first and second opposing ends, the opening formed in each such gasket being disposed proximate to the first end of the elongated sheet, allowing a user to manipulate the second end of each elongated sheet to align a microphone receiving within the opening thereof with a symmetrical aperture of the microphone carrier.

10. The apparatus recited by claim 9 wherein the microphone carrier is formed of a translucent material for allowing a user to visualize the first and second microphones, and to visualize the first and second gaskets, through the smooth opposing surface of the microphone carrier.

11. A method for measuring the phase and magnitude differences between first and second microphones in response to an excitation signal issued by an audible signal source, comprising the steps of:

a) providing a microphone carrier, the microphone carrier having a mounting surface for supporting first and second microphones and having a smooth opposing surface opposite the mounting surface;

b) rotatably supporting the microphone carrier about an axis of rotation;

c) providing first and second symmetrical apertures each extending through the microphone carrier from the mounting surface to the smooth opposing surface, the first and second symmetrical apertures being substantially co-linear with, and lying on opposite sides of, the axis of rotation of the microphone carrier, and equidistant from the axis of rotation;

d) sealingly mounting the first microphone against a portion of the mounting surface surrounding the first symmetrical aperture to cover the first fixed symmetrical aperture;

e) sealingly mounting the second microphone against a portion of the mounting surface surrounding the second symmetrical aperture to cover the second symmetrical aperture;

f) orienting the microphone carrier to position the first symmetrical aperture relatively close to the audible signal source, and measuring the excitation signal received by the first microphone;

g) re-orienting the microphone carrier to position the second symmetrical aperture relatively close to the audible signal source, and measuring the excitation signal received by the second microphone; and h) deriving phase and magnitude differences between the first and second microphones from the signals measured in steps f) and g).

12. The method recited by claim 11 wherein the step of re-orienting the microphone carrier to position the second symmetrical aperture relatively close to the audible signal source includes the step of rotating the microphone carrier 180 angular degrees from its position corresponding to the first symmetrical aperture being relatively close to the audible signal source.

13. A method for measuring the phase and magnitude differences between first and second microphones in response to an excitation signal issued by an audible signal source, comprising the steps of:

a) providing a microphone carrier, the microphone carrier having a mounting surface for supporting first and second microphones and having a smooth opposing surface opposite the mounting surface;

b) rotatably supporting the microphone carrier about an axis of rotation;

c) providing first and second symmetrical apertures each extending through the microphone carrier from the mounting surface to the smooth opposing surface, the first and second symmetrical apertures being substantially co-linear with, and lying on opposite sides of, the axis of rotation of the microphone carrier, and equidistant from the axis of rotation;

d) sealingly mounting the first microphone against a portion of the mounting surface surrounding the first symmetrical aperture to cover the first fixed symmetrical aperture;

e) sealingly mounting the second microphone against a portion of the mounting surface surrounding the second symmetrical aperture to cover the second symmetrical aperture;

f) orienting the microphone carrier to position the first symmetrical aperture relatively close to the audible signal source measuring the excitation signal received by each of the first and second microphones;

g) re-orienting the microphone carrier to position the second symmetrical aperture relatively close to the audible signal source, and measuring the excitation signal received by each of the first and second microphones; and h) deriving phase and magnitude differences between the first and second microphones based upon the measurements set forth in steps f) and g) herein.

14. A method for measuring the phase and magnitude differences between first and second microphones in response to an excitation signal issued by an audible signal source, comprising the steps of:

a) providing a microphone carrier, the microphone carrier having a mounting surface for supporting first and second microphones and having a smooth opposing surface opposite the mounting surface;

b) rotatably supporting the microphone carrier about an axis of rotation;

c) providing first and second symmetrical apertures each extending through the microphone carrier from the mounting surface to the smooth opposing surface, the first and second symmetrical apertures being substantially co-linear with, and lying on opposite sides of, the axis of rotation of the microphone carrier, and equidistant from the axis of rotation;

d) sealingly mounting the first microphone against a portion of the mounting surface surrounding the first symmetrical aperture to cover the first fixed symmetrical aperture;

e) sealingly mounting the second microphone against a portion of the mounting surface surrounding the second symmetrical aperture to cover the second symmetrical aperture;

f) orienting the microphone carrier to position the first symmetrical aperture relatively close to the audible signal source, and measuring the excitation signal received by the first microphone;

g) re-orienting the microphone carrier to position the second symmetrical aperture relatively close to the audible signal source, and measuring the excitation signal received by the second microphone;

h) deriving phase and magnitude differences between the first and second microphones from the signals measured in steps f) and g);

wherein:

the step of sealingly mounting the first microphone against a portion of the mounting surface surrounding the first symmetrical aperture includes the step of inserting a first gasket against the mounting surface for forming a seal between the mounting surface and the first microphone, and aligning an opening of the first gasket with the first symmetrical aperture for allowing the excitation signal to pass through the first symmetrical aperture to the first microphone; and the step of sealingly mounting the second microphone against a portion of the mounting surface surrounding the second symmetrical aperture includes the step of inserting a second gasket against the mounting surface for forming a seal between the mounting surface and the second microphone, and aligning an opening of the second gasket with the second symmetrical aperture for allowing the excitation signal to pass through the second symmetrical aperture to the second microphone.

15. The method recited by claim 14 wherein the step of sealingly mounting the first microphone against the mounting surface includes the steps of:

a) providing an elongated sheet of resilient compressible material extending between first and second opposing ends;
b) forming a hole proximate to the first end of the elongated sheet for receiving a microphone;
c) applying a foam block against the first microphone and against the first end of the elongated sheet to urge the first microphone and the first end of the elongated sheet against the mounting surface of the microphone carrier, while leaving the second end of the elongated sheet exposed;
d) manipulating the second end of the elongated sheet to properly align the first microphone relative to the first symmetrical aperture; and
e) thereafter clamping the foam block against the mounting surface of the microphone carrier.

\* \* \* \* \*